(12) United States Patent
Tang et al.

(10) Patent No.: US 9,265,154 B2
(45) Date of Patent: Feb. 16, 2016

(54) PACKAGING SUBSTRATE AND FABRICATION METHOD THEREOF

(71) Applicant: Siliconware Precision Industries Co., Ltd., Taichung (TW)

(72) Inventors: Shao-Tzu Tang, Taichung (TW); Chi-Ching Ho, Taichung (TW); Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/461,828

(22) Filed: Aug. 18, 2014

(65) Prior Publication Data

US 2015/0305162 A1 Oct. 22, 2015

(30) Foreign Application Priority Data

Apr. 22, 2014 (TW) .............................. 103114466 A (51) Int. Cl.
*H01L 21/8242* (2006.01)
*H05K 1/18* (2006.01)
*H05K 1/11* (2006.01)
*H05K 3/10* (2006.01)
*H01L 49/02* (2006.01)

(52) U.S. Cl.
CPC ............... *H05K 1/186* (2013.01); *H05K 1/115* (2013.01); *H05K 3/10* (2013.01); *H01L 28/40* (2013.01)

(58) Field of Classification Search
CPC ...................................................... H01L 28/40
See application file for complete search history.

(56) References Cited

U.S. PATENT DOCUMENTS

| 8,476,535 B2* | 7/2013 | Sahara et al. | 174/260 |
| 2009/0261466 A1* | 10/2009 | Pagaila et al. | 257/686 |
| 2010/0012364 A1* | 1/2010 | Kim et al. | 174/260 |
| 2012/0199958 A1* | 8/2012 | Horibe | 257/659 |
| 2013/0021772 A1* | 1/2013 | Xiao | 361/818 |

* cited by examiner

*Primary Examiner* — Angel Roman
(74) *Attorney, Agent, or Firm* — Mintz Levin Cohn Ferris Glovsky and Popeo, P.C.; Peter F. Corless; Steven M. Jensen (57) ABSTRACT

A fabrication method of a packaging substrate is provided, which includes the steps of: forming first conductive portions on a carrier; sequentially forming a conductive post and an alignment layer on each of the first conductive portions; forming an encapsulant on the carrier for encapsulating the first conductive portions, the conductive posts and the alignment layers; forming a conductive via on each of the alignment layers in the encapsulant and forming second conductive portions on the conductive vias and the encapsulant; and removing the carrier. Each of the first conductive portions and the corresponding conductive post, the alignment layer and the conductive via form a conductive structure. The alignment layer has a vertical projection area larger than those of the conductive post and the conductive via to thereby reduce the size of the conductive post and the conductive via, thus increasing the wiring density and the electronic element mounting density.

14 Claims, 8 Drawing Sheets

FIG. 4D

PACKAGING SUBSTRATE AND FABRICATION METHOD THEREOF

CROSS-REFERENCES TO RELATED APPLICATIONS

This application claims under 35 U.S.C. §119(a) the benefit of Taiwanese Application No. 103114466, filed Apr. 22, 2014, the entire contents of which is incorporated herein by reference.

BACKGROUND OF THE INVENTION

1. Field of the Invention

The present invention relates to packaging substrates and fabrication methods thereof, and more particularly, to a packaging substrate having an electronic element and a fabrication method thereof.

2. Description of Related Art

Figure 1:
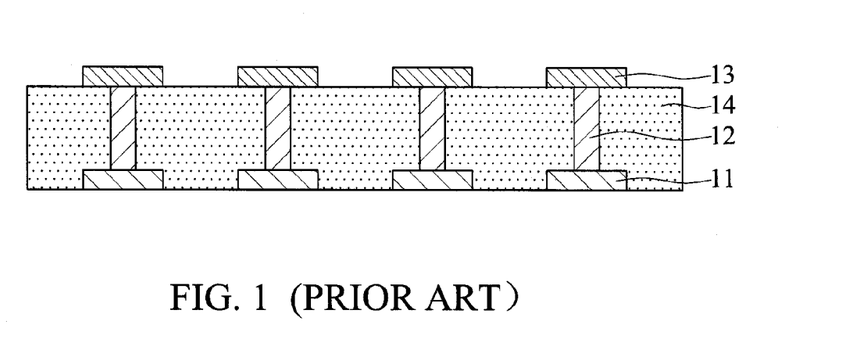
FIG. 1 is a schematic cross-sectional view of a conventional packaging substrate of a molded interconnection system (MIS)

FIG. 1 is a schematic cross-sectional view of a conventional packaging substrate of a molded interconnection system (MIS). Referring to FIG. 1, a plurality of conductive posts 12 are respectively formed on a plurality of first conductive portions 11, and a plurality of second conductive portions 13 are further respectively formed on the conductive posts 12. Then, the first conductive portions 11 and the conductive posts 12 are encapsulated by an encapsulant 14. In the above-described packaging substrate, if the conductive posts 12 have a large height-width ratio, it will be difficult for the conductive posts 12 to achieve a preferred electroplating effect. On the other hand, current capacitors generally have a height above 110 um. Therefore, to embed such a capacitor in the above-described packaging substrate, the height of the conductive posts 12 must be increased.

Figure 2:
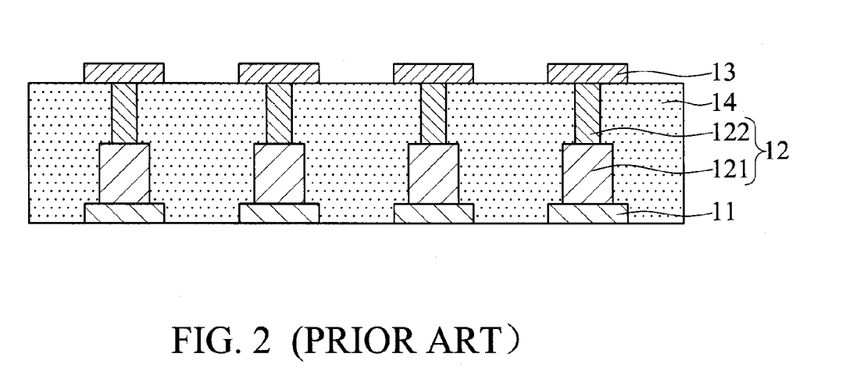
FIG. 2 is a schematic cross-sectional view of another conventional packaging substrate of a molded interconnection system.

Accordingly, another packaging substrate having an improved structure is provided. Referring to FIG. 2, each of the conductive posts 12 is divided into a first post portion 121 and a second post portion 122. The first post portion 121 and the second post portion 122 are formed through separate electroplating processes, which, however, complicate the fabrication process and lead to more accumulated error. To keep the area consumption of the second conductive portion 13 unchanged, the area of the first post portion 121 must be larger than that of the second post portion 122 so as to provide sufficient alignment tolerance for the second post portion 122. Similarly, the area of the first conductive portion 11 must be larger than that of the first post portion 121 so as to provide sufficient alignment tolerance for the first post portion 121. Therefore, the area of the first conductive portion 11 is increased, thus reducing the space available for wiring.

Currently, as electronic products are developed toward the trend of miniaturization, manufacturers make much effort to achieve high electronic element mounting density and high wiring density.

Therefore, how to overcome the above-described drawbacks has become critical.

SUMMARY OF THE INVENTION

In view of the above-described drawbacks, the present invention provides a packaging substrate, which comprises: an encapsulant having opposite top and bottom surfaces; a plurality of conductive structures embedded in the encapsulant, wherein each of the conductive structures comprises: a first conductive portion embedded in the encapsulant and exposed from the bottom surface of the encapsulant; and a conductive post, an alignment layer and a conductive via sequentially formed on the first conductive portion, wherein one end of the conductive via is exposed from the top surface of the encapsulant, the alignment layer having a vertical projection area larger than that of the conductive post and that of the conductive via; a plurality of second conductive portions formed on the conductive vias and the top surface of the encapsulant; and an electronic element embedded in the encapsulant.

The present invention further provides a method for fabricating a packaging substrate, which comprises the steps of: forming a plurality of first conductive portions on a carrier; disposing an electronic element on a part of the first conductive portions and forming a conductive post on each of the remaining first conductive portions; forming an alignment layer on the conductive post, wherein the alignment layer has a vertical projection area larger than that of the conductive post; forming an encapsulant on the carrier for encapsulating the first conductive portions, the electronic element, the conductive posts and the alignment layers, wherein the encapsulant has a bottom surface bonded to the carrier and a top surface opposite to the bottom surface; forming a conductive via on each of the alignment layers in the encapsulant such that each of the first conductive portions and the conductive post, the alignment layer and the conductive via sequentially formed on the first conductive portion form a conductive structure, and forming a plurality of second conductive portions on the conductive vias and the top surface of the encapsulant, wherein the vertical projection area of the alignment layer of each of the conductive structures is larger than that of the conductive via of the conductive structure; and removing the carrier to expose the first conductive portions.

Therefore by forming the alignment layer between the conductive post and the conductive via and causing the vertical projection area of the alignment layer on the first conductive portion to be larger than those of the conductive post and the conductive via on the first conductive portion, the present invention provides a sufficient alignment tolerance for the conductive via such that the area consumption of the conductive post and the first conductive portion can be reduced or kept unchanged, thereby increasing the wiring density and the electronic element mounting density.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

First Embodiment

Figure 3A:
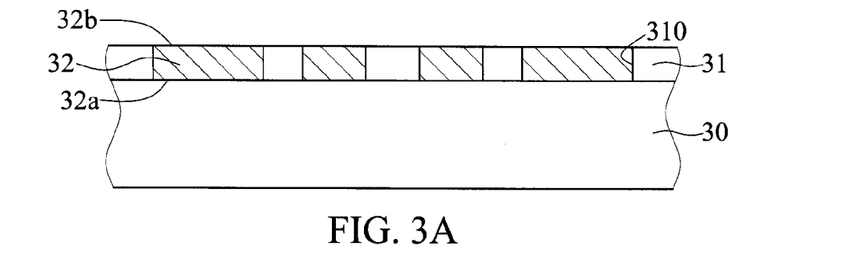
FIGS. 3A to 3N are schematic cross-sectional views showing a method for fabricating a packaging substrate according to a first embodiment of the present invention.
Figure 3B:
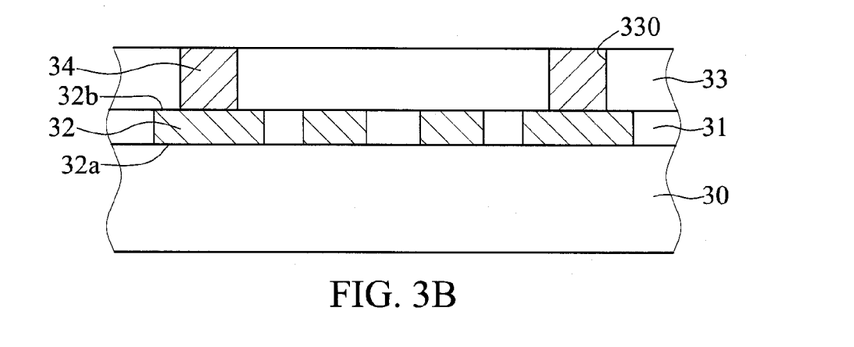
Figure 3C:
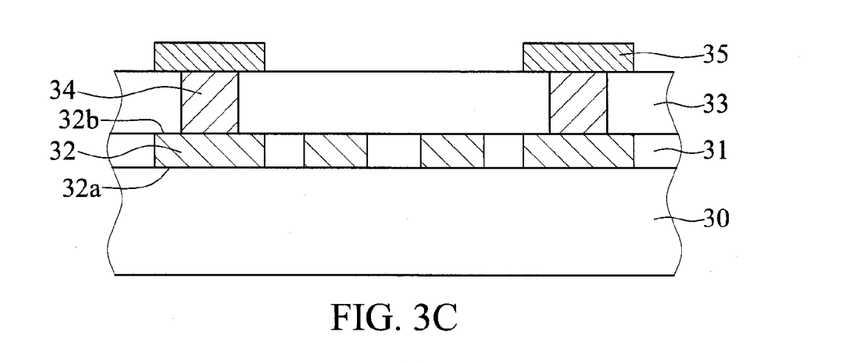
Figure 3D:
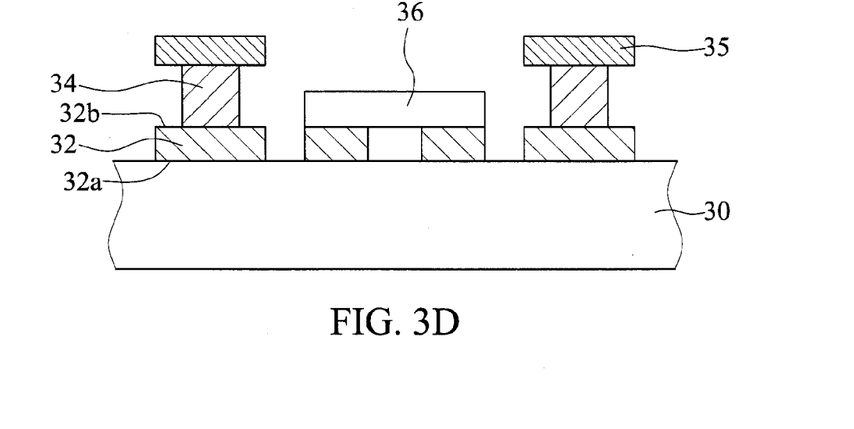
Figure 3E:
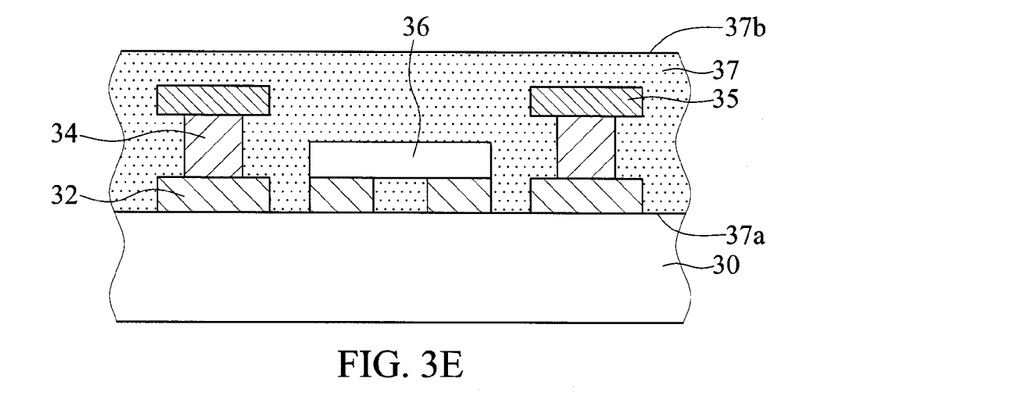
Figure 3F:
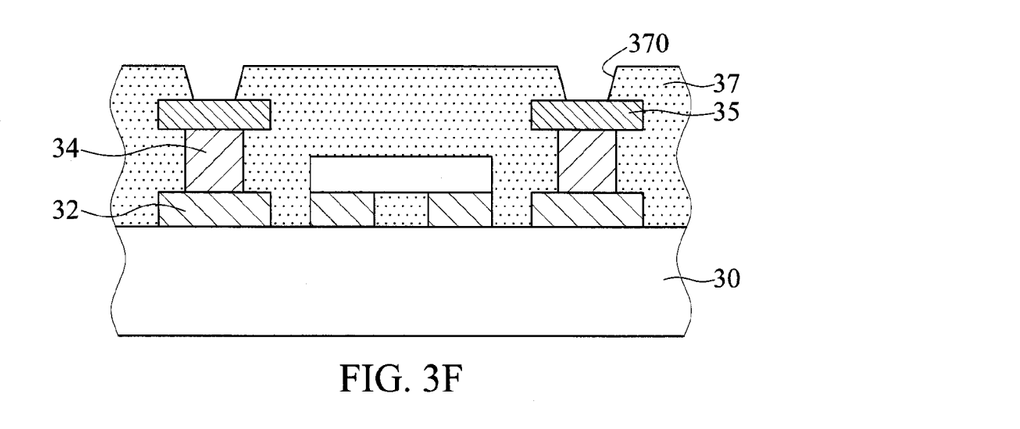
Figure 3G:
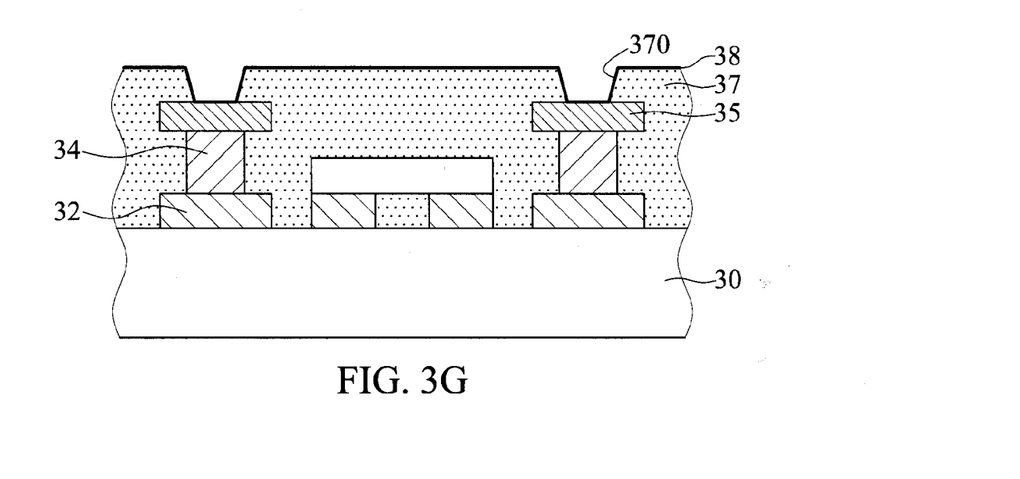
Figure 3H:
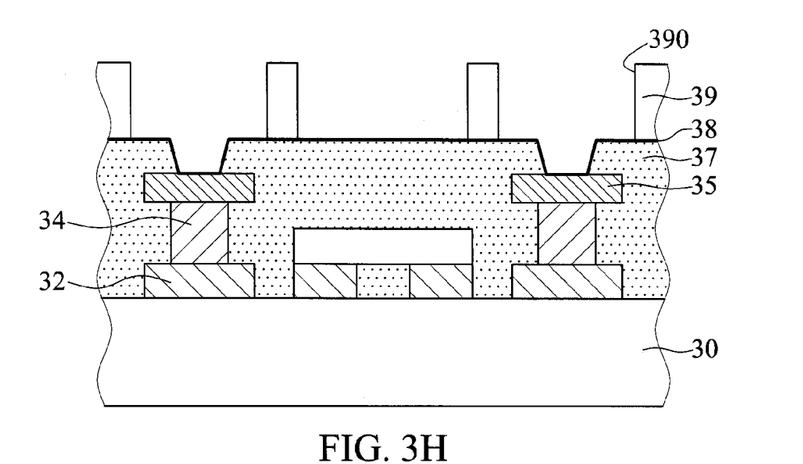
Figure 3I:
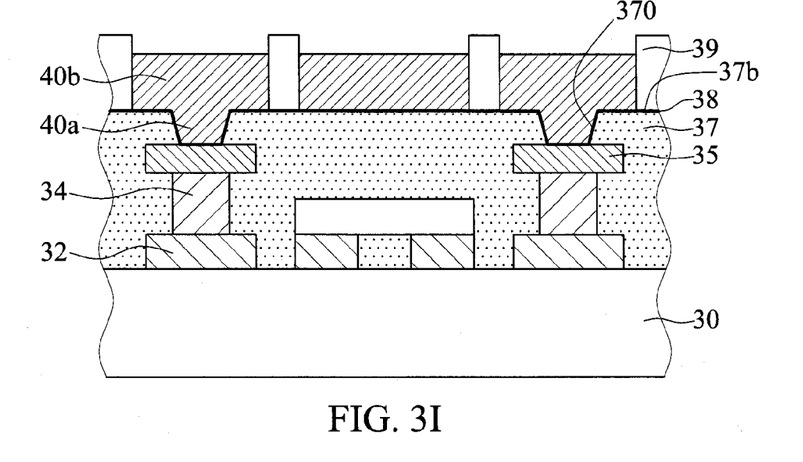
Figure 3J:
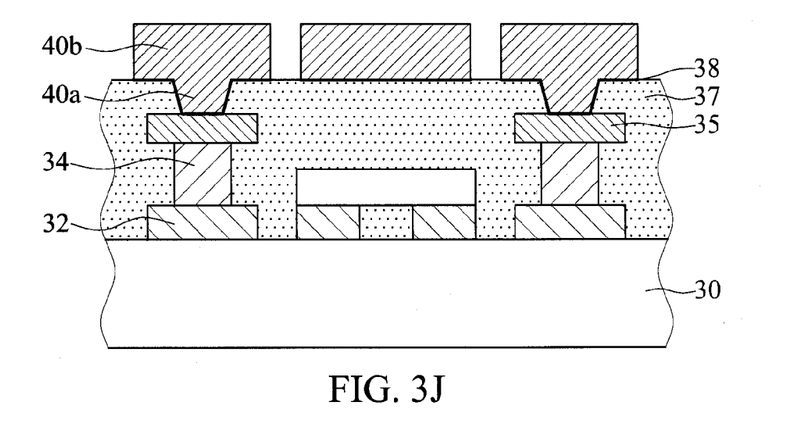
Figure 3K:
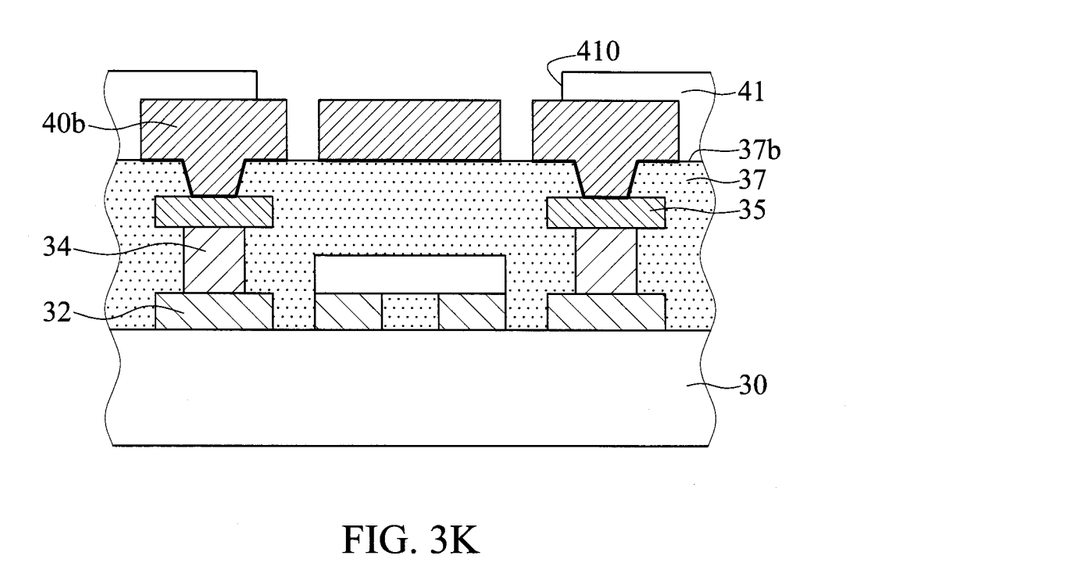
Figure 3L:
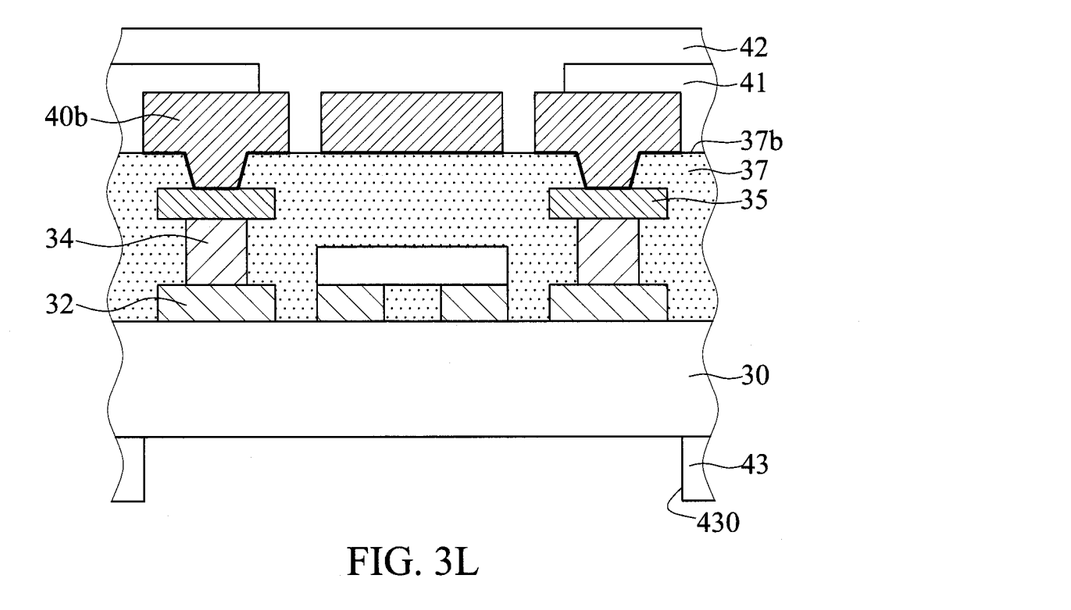
Figure 3M:
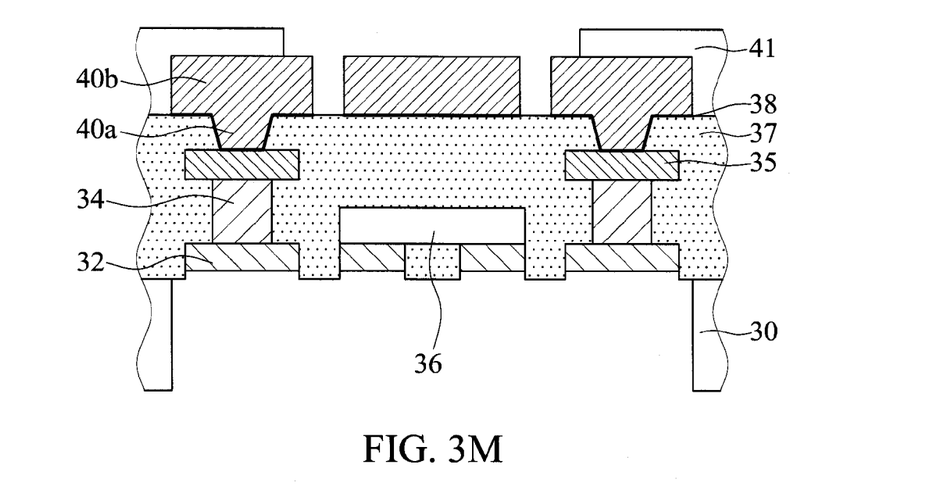
Figure 3N:
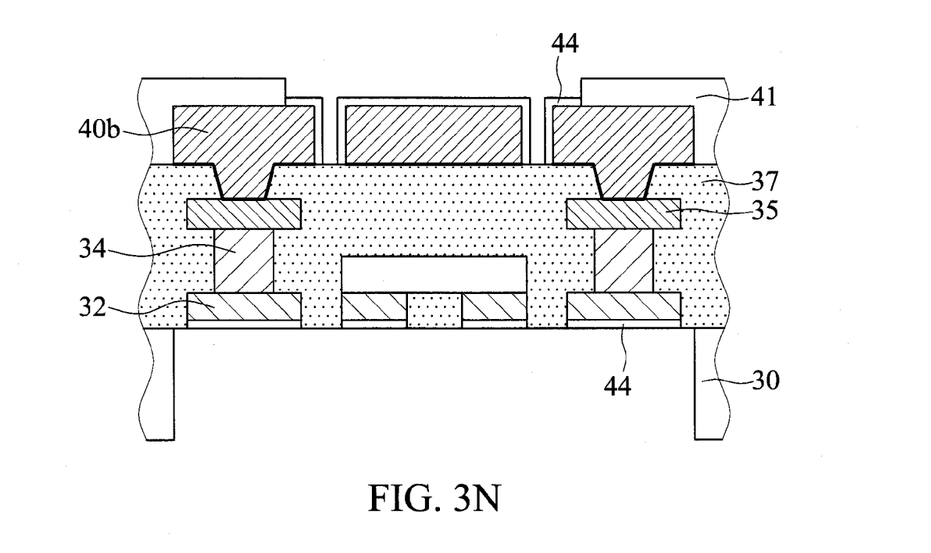

FIGS. 3A to 3N are schematic cross-sectional views showing a method for fabricating a packaging substrate 2 according to a first embodiment of the present invention.

Referring to FIG. 3A, a first resist layer 31 is formed on a top surface of a carrier 30 and has a plurality of first openings 310. A plurality of first conductive portions 32 are formed in the first openings 310 of the first resist layer 31. Each of the first conductive portions 32 has a first surface 32a bonded to the carrier 30 and a second surface 32b opposite to the first surface 32a. The carrier 30 is a steel board.

Referring to FIG. 3B, a second resist layer 33 is formed on the first resist layer 31 and the first conductive portions 32 and has a plurality of second openings 330 formed corresponding in position to the first conductive portions 32 so as to expose portions of the second surfaces 32b of the first conductive portions 32. Then, a plurality of conductive posts 34 are formed on the first conductive portions 32 in the second openings 330 of the second resist layer 33.

Referring to FIG. 3C, an alignment layer 35 is formed on each of the conductive posts 34 and the second resist layer 33 around a periphery of the conductive post 34. The alignment layer 35 can be of any shape. The vertical projection area of the alignment layer 35 on the first conductive portion 32 is larger than the vertical projection area of the conductive post 34 on the first conductive portion 32.

Referring to FIG. 3D, the first resist layer 31 and the second resist layer 33 are removed and an electronic element 36 is disposed on the second surfaces 32b of a part of the first conductive portions 32. The electronic element 36 is a multi-layer ceramic capacitor (MLCC).

Referring to FIG. 3E, an encapsulant 37 is formed on the top surface of the carrier 30 to encapsulate the first conductive portions 32, the conductive posts 34, the electronic element 36 and the alignment layers 35. The encapsulant 37 has a third surface 37a (i.e., a bottom surface) bonded to the carrier 30 and a fourth surface 37b (i.e., a top surface) opposite to the third surface 37a.

Referring to FIG. 3F, the encapsulant 37 is partially removed to form a plurality of openings 370 exposing the alignment layers 35. The openings 370 of the encapsulant 37 can be formed by laser ablation or mechanical drilling.

Referring to FIG. 3G, a conductive layer 38 is formed on the encapsulant 37 and the alignment layers 35.

Referring to FIG. 3H, a third resist layer 39 is formed on the conductive layer 38 and has a plurality of third openings 390.

Referring to FIG. 3I, by using the conductive layer 38 as a current conductive path, an electroplating process, such as copper electroplating, is performed to form a plurality of conductive vias 40a in the openings 370 of the encapsulant 37. As such, each of the first conductive portions 32 and the conductive post 34, the alignment layer 35 and the conductive via 40a sequentially formed on the first conductive portion 32 form a conductive structure. Further, a plurality of second conductive portions 40b are formed on the fourth surface 37b of the encapsulant 37 and the conductive vias 40a and electrically connected to the first conductive portions 32. The vertical projection area of the alignment layer 35 on the first conductive portion 32 is larger than that of the conductive via 40a on the first conductive portion 32. The alignment layer 35 is positioned between the conductive post 34 and the conductive via 40a. The conductive vias 40a and the second conductive portions 40b are integrally formed.

Referring to FIG. 3J, the third resist layer 39 and the conductive layer 38 covered by the third resist layer 39 are removed.

Referring to FIG. 3K, an insulating layer 41 is formed on the second conductive portions 40b and the fourth surface 37b of the encapsulant 37 and has a plurality of openings 410 exposing a part of the second conductive portions 40b.

Referring to FIG. 3L, a fourth resist layer 42 is formed on the insulating layer 41, the second conductive portions 40b and the fourth surface 37b of the encapsulant 37, and a fifth resist layer 43 is formed on the bottom surface of the carrier 30 and has an opening 430.

Referring to FIG. 3M, the carrier 30 in the opening 430 and a portion of each of the first conductive portions 32 (if needed) are removed. Then, the fourth resist layer 42 and the fifth resist layer 43 are removed. If needed, the carrier 30 can be completely removed.

Referring to FIG. 3N, a surface processing layer 44 is formed on exposed surfaces of the first conductive portions 32 and the second conductive portions 40b. The surface processing layer 44 can be made of Ni/Au, Ni/Pd/Au or OSP (organic solderability preservative).

The present invention further provides a packaging substrate, which has: an encapsulant 37 having opposite top and bottom surfaces; a plurality of conductive structures embedded in the encapsulant 37, wherein each of the conductive structures comprises: a first conductive portion 32 embedded in the encapsulant 37 and exposed from the bottom surface of the encapsulant 37; and a conductive post 34, an alignment layer 35 and a conductive via 40a sequentially formed on the first conductive portion 32, wherein one end of the conductive via 40a is exposed from the top surface of the encapsulant 37, the vertical projection area of the alignment layer 35 on the first conductive portion 32 being larger than those of the conductive post 34 and the conductive via 40a on the first conductive portion 32; a plurality of second conductive portions 40b formed on the conductive vias 40a and the top surface of the encapsulant 37; and an electronic element 36 embedded in the encapsulant 37.

The above-described packaging substrate can further have an insulating layer 41 formed on the second conductive portions 40b and the top surface of the encapsulant 37 and having a plurality of openings 410 for exposing a part of the second conductive portions 40b.

The above-described packaging substrate can further have a surface processing layer 44 formed on exposed surfaces of the first conductive portions 32 and the second conductive portions 40b.

In the above-described packaging substrate, the electronic element 36 can be a multi-layer ceramic capacitor (MLCC).

Second Embodiment

FIGS. 4A to 4D are schematic cross-sectional views showing a method for fabricating a packaging substrate according to a second embodiment of the present invention. The present embodiment is similar to the first embodiment. The main difference of the present embodiment from the first embodiment is detailed as follows.

Figure 4A:
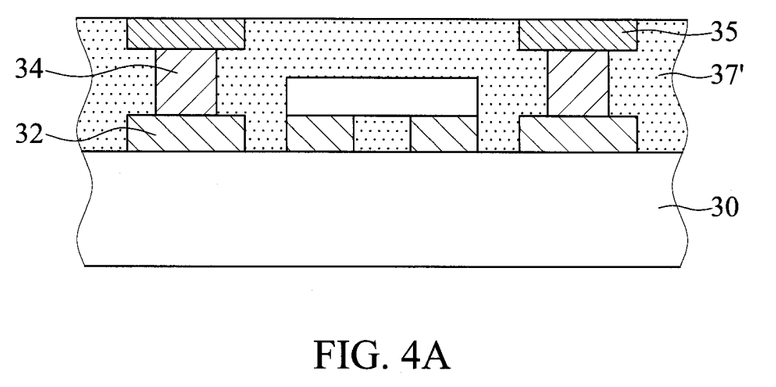
FIGS. 4A to 4D are schematic cross-sectional views showing a method for fabricating a packaging substrate according to a second embodiment of the present invention.

Referring to FIG. 4A, continued from FIG. 3E, the encapsulant 37 is ground to be flush with the alignment layers 35.

Figure 4B:
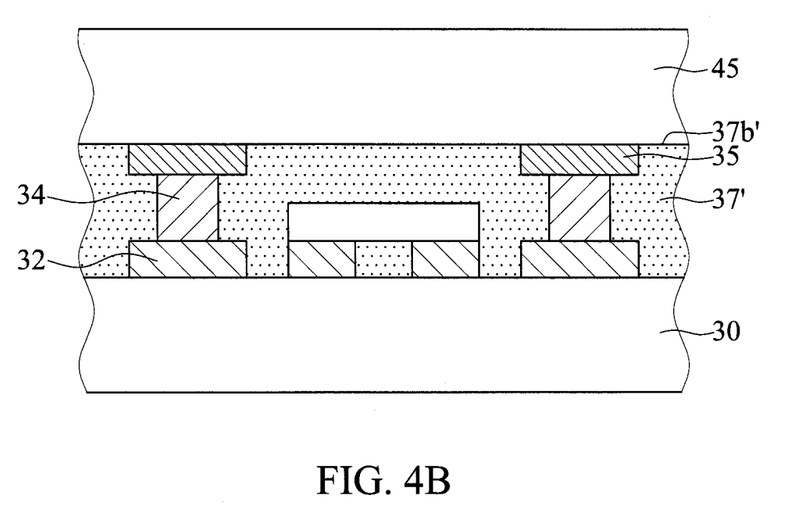

Referring to FIG. 4B, a dielectric layer 45 is formed on the fourth surface 37b of the encapsulant 37 and the alignment layers 35. The dielectric layer 45 can be made of polyimide or molding compound.

Figure 4C:
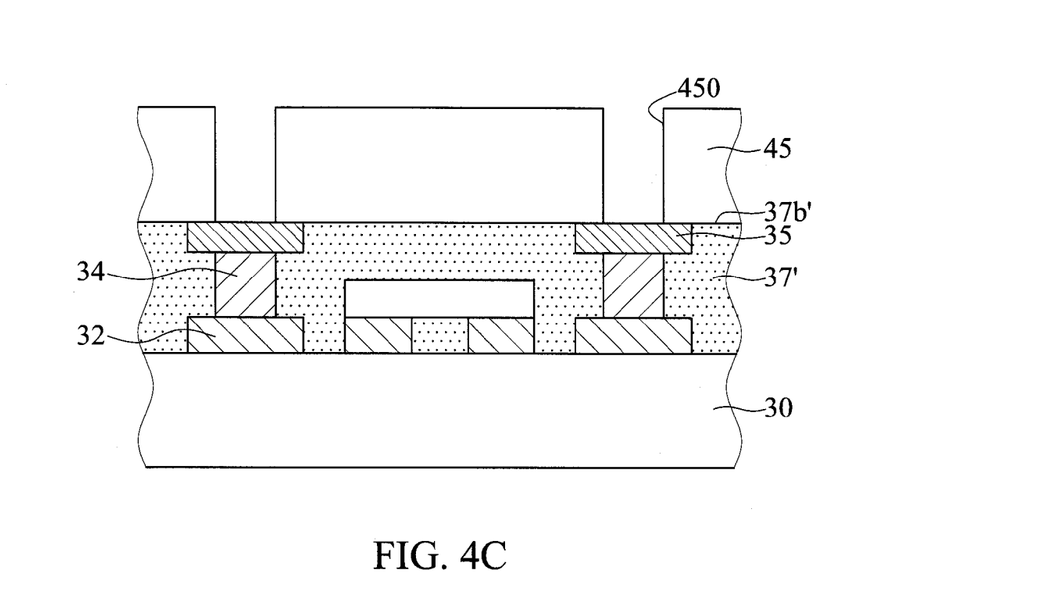

Referring to FIG. 4C, the dielectric layer 45 is partially removed to form a plurality of openings 45 exposing the alignment layers 35.

Figure 4D:
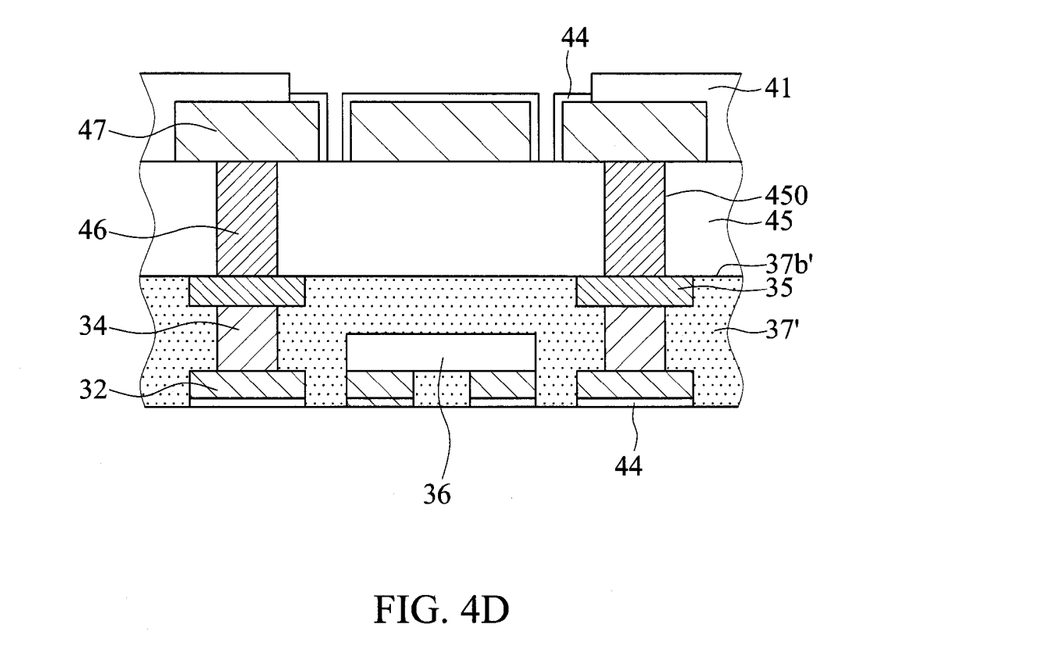

Referring to FIG. 4D, a plurality of conductive vias 46 are formed on the alignment layers 35 in the openings 450 of the dielectric layer 45, and a plurality of second conductive portions 47 are formed on the dielectric material 45 and the conductive vias 46 so as to be electrically connected to the first conductive portions 32 through the conductive vias 46, the alignment layers 35 and the conductive posts 34. The vertical projection area of each of the alignment layers 35 on the corresponding first conductive portion 32 is greater than that of the conductive via 46 on the first conductive portion 32. The alignment layer 35 is positioned between the conductive post 34 and the conductive via 46. Similar to the first embodiment, the carrier 30 is removed and the insulating layer 41 and the surface processing layer 44 are formed.

Further, a packaging substrate is provided according to the second embodiment of the present invention. The packaging substrate of the second embodiment is similar to the packaging substrate of the first embodiment. The difference therebetween is that the encapsulant of the packaging substrate of the second embodiment has an encapsulating layer (encapsulant 37) for encapsulating the first conductive portions 32, the conductive posts 34, the electronic element 36 and the alignment layers 35, and a dielectric layer 45 formed on the encapsulating layer and the alignment layers 35 for encapsulating the conductive vias 46. The dielectric layer 45 can be made of polyimide or molding compound.

Therefore by forming the alignment layer between the conductive post and the conductive via and causing the vertical projection area of the alignment layer on the first conductive portion to be larger than those of the conductive post and the conductive via on the first conductive portion, the present invention provides a sufficient alignment tolerance for the conductive via such that the area consumption of the conductive post and the first conductive portion can be reduced or kept unchanged, thereby increasing the wiring density and the electronic element mounting density. Further, the dielectric layer made of polyimide facilitates the formation of the conductive vias and strengthens the bonding between the conductive vias and the second conductive portions so as to improve the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A packaging substrate, comprising:
   an encapsulant having opposite top and bottom surfaces, wherein the encapsulant is composed of only a single layer;
   a plurality of conductive structures embedded in the encapsulant, wherein each of the conductive structures comprises:
      a first conductive portion embedded in the encapsulant and exposed from the bottom surface of the encapsulant; and
      a conductive post, an alignment layer and a conductive via sequentially formed on the first conductive portion, wherein one end of the conductive via is exposed from the top surface of the encapsulant, the alignment layer having a vertical projection area larger than that of the conductive post and that of the conductive via;
   a plurality of second conductive portions formed on the conductive vias and the top surface of the encapsulant; and
   an electronic element embedded in the encapsulant.

2. The substrate of claim 1, further comprising an insulating layer formed on the second conductive portions and the top surface of the encapsulant and having a plurality of openings for exposing a part of the second conductive portions.

3. The substrate of claim 1, further comprising a surface processing layer formed on exposed surfaces of the first conductive portions and the second conductive portions.

4. The substrate of claim 1, wherein the electronic element is a multi-layer ceramic capacitor (MLCC).

5. The substrate of claim 1, wherein the encapsulant comprises an encapsulating layer for encapsulating the first conductive portions, the electronic element, the conductive posts and the alignment layers, and a dielectric layer formed on the encapsulating layer and the alignment layers for encapsulating the conductive vias.

6. The substrate of claim 1, wherein the conductive vias and the second conductive portions are integrally formed.

7. A method for fabricating a packaging substrate, comprising the steps of:
   forming a plurality of first conductive portions on a carrier;
   disposing an electronic element on a part of the first conductive portions and forming a conductive post on each of the remaining first conductive portions;
   forming an alignment layer on the conductive post, wherein the alignment layer has a vertical projection area larger than that of the conductive post;
   forming an encapsulant on the carrier for encapsulating the first conductive portions, the electronic element, the conductive posts and the alignment layers, wherein the encapsulant has a bottom surface bonded to the carrier and a top surface opposite to the bottom surface, wherein the encapsulant is composed of only a single layer;
   forming a conductive via on each of the alignment layers in the encapsulant such that each of the first conductive portions and the conductive post, the alignment layer and the conductive via sequentially formed on the first conductive portion form a conductive structure, and forming a plurality of second conductive portions on the conductive vias and the top surface of the encapsulant, wherein the vertical projection area of the alignment layer of each of the conductive structures is larger than that of the conductive via of the conductive structure; and
   removing the carrier to expose the first conductive portions.

8. The method of claim 7, wherein the conductive vias and the second conductive portions are integrally formed.

9. The method of claim 7, wherein a plurality of openings are formed in the encapsulant by laser ablation or mechanical drilling so as to form the conductive vias in the openings of the encapsulant.

10. The method of claim 7, after forming the second conductive portions, further comprising forming an insulating layer on the second conductive portions and the top surface of the encapsulant, wherein the insulating layer has a plurality of openings for exposing a part of the second conductive portions.

11. The method of claim 7, after forming the second conductive portions, further comprising forming a surface processing layer on exposed surfaces of the first conductive portions and the second conductive portions.

12. The method of claim 7, wherein the electronic element is a multi-layer ceramic capacitor (MLCC).

13. The method of claim 7, wherein the encapsulant comprises an encapsulating layer formed on the carrier for encapsulating the first conductive portions, the electronic element, the conductive posts and the alignment layers, and a dielectric layer formed on the encapsulating layer and the alignment layers for encapsulating the conductive vias.

14. The method of claim 13, wherein forming the encapsulant comprises the steps of:
  forming the encapsulating layer;
  grinding the encapsulating layer so as to cause the encapsulating layer to be flush with the alignment layers; and
  forming the dielectric layer on the encapsulating layer and the alignment layers.

* * * * *